(12) United States Patent
Kasselman et al.

(10) Patent No.: US 12,061,240 B2
(45) Date of Patent: Aug. 13, 2024

(54) BATTERY FLEET MONITORING SYSTEMS

(71) Applicant: Analog Devices International Unlimited Company, Limerick (IE)

(72) Inventors: Pieter Retief Kasselman, Dublin (IE); Shane O'Mahony, Ballybraher (IE); Rosemary B. Ryan, Annacotty (IE); Steven Furr, Ottowa (CA)

(73) Assignee: Analog Devices International Unlimited Company, Limerick (IE)

( * ) Notice: Subject to any disclaimer, the term of this patent is extended or adjusted under 35 U.S.C. 154(b) by 44 days.

(21) Appl. No.: 17/561,400

(22) Filed: Dec. 23, 2021

(65) Prior Publication Data
US 2022/0113356 A1    Apr. 14, 2022

Related U.S. Application Data

(63) Continuation of application No. PCT/EP2020/068083, filed on Jun. 26, 2020.

(60) Provisional application No. 62/868,837, filed on Jun. 28, 2019.

(51) Int. Cl.
| | | |
|---|---|---|
| *G01R 31/392* | (2019.01) | |
| *G01R 31/367* | (2019.01) | |
| *G01R 31/371* | (2019.01) | |
| *G01R 31/382* | (2019.01) | |
| *H01M 10/42* | (2006.01) | |
| *H01M 10/48* | (2006.01) | |

(52) U.S. Cl.
CPC ......... *G01R 31/392* (2019.01); *G01R 31/367* (2019.01); *G01R 31/371* (2019.01); *G01R 31/382* (2019.01); *H01M 10/4257* (2013.01); *H01M 10/482* (2013.01); *H01M 2010/4271* (2013.01); *H01M 2010/4278* (2013.01)

(58) Field of Classification Search
None
See application file for complete search history.

(56) References Cited

U.S. PATENT DOCUMENTS

| | | | |
|---|---|---|---|
| 7,245,107 B2 | 7/2007 | Moore et al. | |
| 8,922,166 B2 | 12/2014 | White et al. | |
| 9,145,059 B2 | 9/2015 | Gibbs et al. | |
| 9,166,261 B2 | 10/2015 | Ibi et al. | |
| 9,263,776 B2 | 2/2016 | Yun et al. | |

(Continued)

FOREIGN PATENT DOCUMENTS

| | | |
|---|---|---|
| CN | 102024999 A | 4/2011 |
| CN | 102231446 B | 10/2013 |

(Continued)

OTHER PUBLICATIONS

Agyemang et al., The State of Wireless Routers as Gateways for Internet of Things (IoT) Devices. (Year: 2018).*

(Continued)

*Primary Examiner* — Roy Y Yi
(74) *Attorney, Agent, or Firm* — Wolf, Greenfield & Sacks, P.C.

(57) ABSTRACT

A system and method are described for monitoring batteries at various phases of their lifecycle. The batteries may be monitored in non-operational and operational states. The monitoring may be done wirelessly. The information gathered from monitoring the batteries may be used to make decisions about the use of a battery.

11 Claims, 9 Drawing Sheets

(56) References Cited

U.S. PATENT DOCUMENTS

| | | | |
|---|---|---|---|
| 9,316,694 B2 | 4/2016 | Campbell et al. | |
| 9,444,083 B2 | 9/2016 | Yasui et al. | |
| 9,519,028 B2 | 12/2016 | Greenberg | |
| 9,548,519 B2 | 1/2017 | Wade | |
| 9,594,121 B2 | 3/2017 | Frost et al. | |
| 9,668,032 B2 | 5/2017 | Wade et al. | |
| 9,720,478 B2 | 8/2017 | Hanafusa | |
| 9,726,763 B2* | 8/2017 | Dempsey | H01M 10/48 |
| 9,746,524 B2 | 8/2017 | Petrucelli | |
| 10,175,301 B1 | 1/2019 | Brubacher et al. | |
| 2009/0189614 A1 | 7/2009 | Crawford et al. | |
| 2014/0201090 A1 | 7/2014 | Liang | |
| 2014/0229129 A1 | 8/2014 | Campbell et al. | |
| 2014/0342193 A1 | 11/2014 | Mull et al. | |
| 2014/0379285 A1 | 12/2014 | Dempsey et al. | |
| 2015/0239365 A1 | 8/2015 | Hyde et al. | |
| 2015/0263395 A1 | 9/2015 | Okabe et al. | |
| 2016/0248130 A1 | 8/2016 | Kurimoto et al. | |
| 2017/0021738 A1 | 1/2017 | Brochhaus | |
| 2017/0144562 A1 | 5/2017 | Thomas et al. | |
| 2017/0285113 A1 | 10/2017 | Hsiao et al. | |
| 2017/0324124 A1 | 11/2017 | Nakaya | |
| 2018/0097396 A1 | 4/2018 | Qi et al. | |
| 2018/0267109 A1 | 9/2018 | Kutkut | |
| 2019/0033395 A1 | 1/2019 | Karner et al. | |
| 2020/0233956 A1* | 7/2020 | Wang | B60L 53/305 |

FOREIGN PATENT DOCUMENTS

| | | |
|---|---|---|
| CN | 103138019 B | 9/2015 |
| CN | 108258338 A | 7/2018 |
| CN | 107336611 B | 6/2019 |
| CN | 106696730 B | 10/2019 |
| CN | 107681209 B | 12/2019 |
| CN | 111002842 A | 4/2020 |
| DE | 102015004834 A1 | 10/2016 |
| DE | 202018005683 U1 | 3/2019 |
| EP | 0 323 539 A1 | 7/1989 |
| EP | 2 362 478 A1 | 8/2011 |
| EP | 2 530 481 B1 | 8/2018 |
| EP | 3 657 570 A1 | 5/2020 |
| JP | H04-250376 A | 9/1992 |
| JP | 6094446 B2 | 3/2017 |
| KR | 101398344 B1 | 5/2014 |
| WO | WO 2020/077126 A1 | 4/2020 |

OTHER PUBLICATIONS

International Search Report and Written Opinion for International Application No. PCT/IB2021/000434 mailed Nov. 3, 2021.

International Preliminary Report on Patentability mailed Jan. 6, 2022 in connection with International Application No. PCT/EP2020/068083.

International Preliminary Report on Patentability mailed Jan. 5, 2023 in connection with International Application No. PCT/IB2021/000434.

Invitation to Pay Additional Fees for International Application No. PCT/EP2020/068083 mailed Sep. 29, 2020.

International Search Report and Written Opinion for International Application No. PCT/EP2020/068083 mailed Nov. 30, 2020.

[No Author Listed], Electric Vehicle Enhanced Range, Lifetime and Safety ThroughINGenious battery management. Everlasting. 2017. 140 pages.

Kim et al., Cloud-Based Battery Condition Monitoring and Fault Diagnosis Platform for Large-Scale Lithium-Ion Battery Energy Storage Systems. Energies 2018, 11(1):1-15.

Tanizawa et al., Cloud-connected Battery Management System Supporting e-Mobility. Sci. Tech. J. 2015(51):27-35.

* cited by examiner

BATTERY FLEET MONITORING SYSTEMS

CROSS-REFERENCE TO RELATED APPLICATIONS

This application is a Continuation of International Patent Application Serial No. PCT/EP2020/068083, filed Jun. 26, 2020, and entitled "BATTERY FLEET MONITORING SYSTEMS," which is incorporated herein by reference in its entirety.

International Patent Application No. PCT/EP2020/068083 claims the benefit under 35 U.S.C. § 119(e) of U.S. Provisional Patent Application Ser. No. 62/868,837, filed Jun. 28, 2019, and entitled "BATTERY FLEET MONITORING SYSTEMS," which is hereby incorporated by reference herein in its entirety.

FIELD OF THE DISCLOSURE

The present application relates to systems and methods for monitoring fleets of batteries.

BACKGROUND

Battery formation, production and deployment is a rapidly expanding growth area, driven by the need for cleaner alternatives to internal combustion engines in vehicles as diverse as passenger cars, trucks and ships. The scale at which high capacity batteries are being produced, especially Lithium Ion (Li-On) batteries, is unprecedented. Along with this increased scale, new challenges are arising across the supply chain and across the lifecycle of a battery that have not been previously addressed.

BRIEF SUMMARY

A system and method are described for monitoring batteries at various phases of their lifecycle. The batteries may be monitored in non-operational and operational states. The monitoring may be done wirelessly. The information gathered from monitoring the batteries may be used to make decisions about the use of a battery.

According to an aspect of the present application, a battery management system is provided, comprising: at least one processor; and a storage device storing processor-executable instructions which, when executed by the at least one processor, cause the at least one processor to: aggregate state of health information of a plurality of batteries in a non-operational state. In some embodiments, the plurality of batteries is a first plurality of batteries, and the processor-executable instructions, when executed by the at least one processor, cause the at least one processor to further aggregate state of health information of a second plurality of batteries in an operational state. In some embodiments, the state of health information comprises state of charge information. In some embodiments, the processor-executable instructions, when executed by the at least one processor, cause the at least one processor further to store the state of health information in a blockchain. In some embodiments, the processor-executable instructions, when executed by the at least one processor, cause the at least one processor to perform anomaly detection among the state of health information of the plurality of batteries. In some embodiments, the processor-executable instructions, when executed by the at least one processor, cause the at least one processor to provide a recommended use of a first battery of the plurality of batteries.

According to an aspect of the present application, a method of managing a fleet of batteries is provided, comprising: aggregating state of health information of a plurality of batteries in a non-operational state at one or more locations remote. In some embodiments, the plurality of batteries is a first plurality of batteries, and the method further comprises aggregating state of health information of a second plurality of batteries in an operational state. In some embodiments, the state of health information comprises state of charge information. In some embodiments, the method further comprises storing the state of health information in a blockchain. In some embodiments, the method further comprises performing anomaly detection among the state of health information of the plurality of batteries. In some embodiments, the method further comprises recommending use of a first battery of the plurality of batteries. In some embodiments, the method further comprises, in response to analyzing the state of health information, providing an updated sensing algorithm to a node configured to sense state of health information of a first battery of the plurality of batteries.

According to an aspect of the present application, a system for monitoring battery health is provided, the system comprising: a wireless gateway disposed at a location including a plurality of batteries in a non-operational state, the wireless gateway being configured to wirelessly communicate with the plurality of batteries to exchange data regarding state of health of the plurality of batteries. In some embodiments, the wireless gateway is in operative communication with a battery lifecycle insight system. In some embodiments, the wireless gateway is configured to pass state of health monitoring algorithms from the battery lifecycle insight system to the plurality of batteries. In some embodiments, the wireless gateway is configured to pass the data regarding state of health of the plurality of batteries to the battery lifecycle insight system. In some embodiments, the wireless gateway is a first wireless gateway, and the system further comprises a second wireless gateway disposed in a vicinity of the first wireless gateway and configured to exchange data with the first wireless gateway. In some embodiments, the plurality of batteries comprises a first battery and a second battery, and the wireless gateway is configured to received data regarding state of health of the first battery via the second battery. In some embodiments, the wireless gateway is configured to send firmware updates to the plurality of batteries.

BRIEF DESCRIPTION OF DRAWINGS

Various non-limiting embodiments of the technology are described herein with reference to the following figures. It should be appreciated that the figures are not necessarily drawn to scale. Items appearing in multiple figures are indicated by the same reference numeral in all figures in which they appear. For purposes of clarity, not every component may be labeled in every drawing.

DETAILED DESCRIPTION

Figure 1:
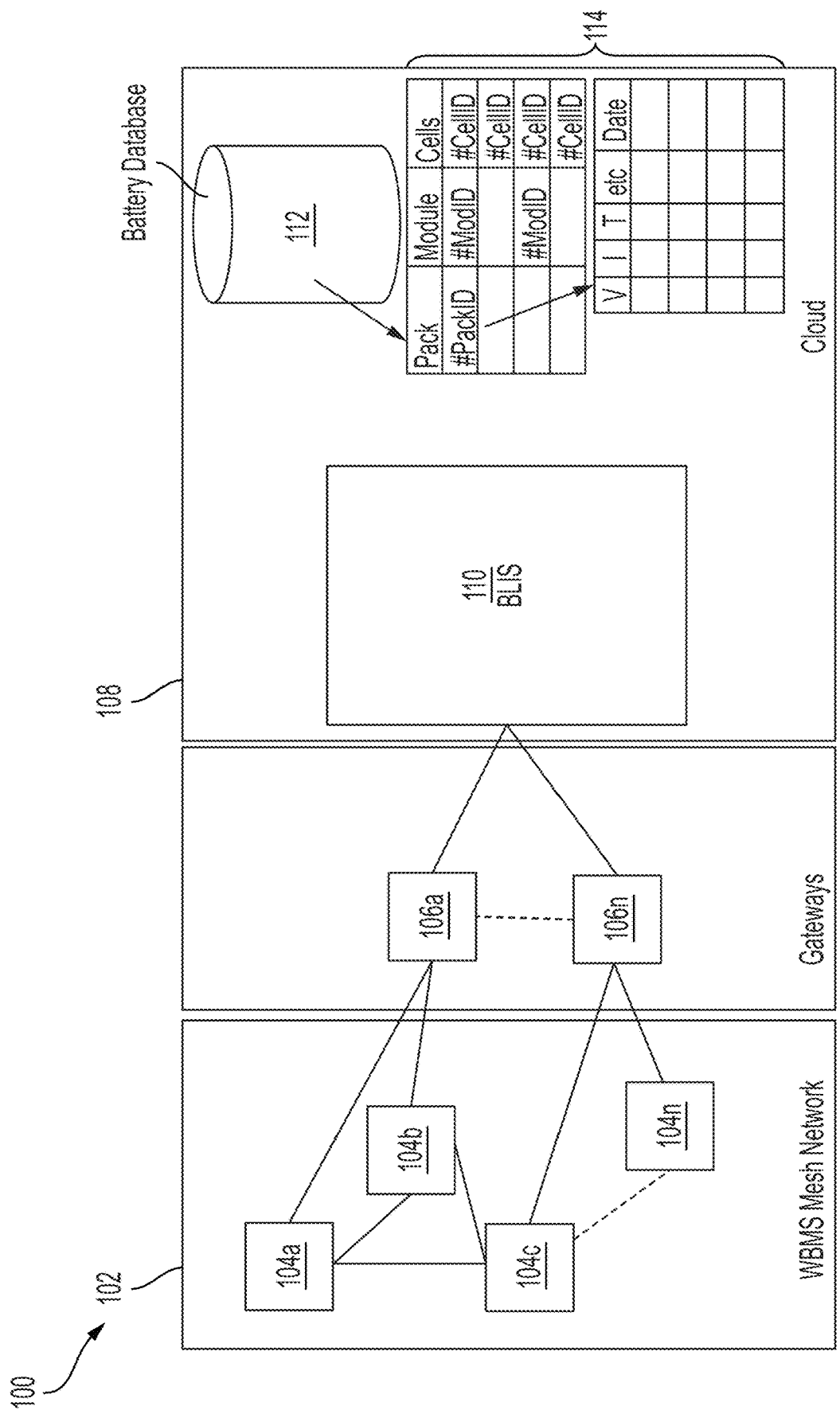
FIG. 1 illustrates an example of a system for monitoring fleets of batteries, according to a non-limiting embodiment of the present application.

Aspects of the present application relate to monitoring of batteries. In some embodiments, fleets of batteries may be monitored wirelessly. The monitoring may be performed in a non-operational state of the batteries in some embodiments, in an operational state in some embodiments, and in both non-operational and operational states in some embodiments. The monitoring may be performed by wirelessly collecting data from individual batteries. The data may relate to state of health, such as state of charge, of the batteries. The data may be aggregated, for example in the Cloud. The aggregated data may be analyzed and various actions may be taken as a result of the data analysis. Over time, the monitoring algorithms may be updated to ensure collection of the desired types of data and to ensure high quality recommendations are being made based on the data analysis. Using such a system, entire fleets of batteries in different locations, states of usage, and stages of their lifecycle, may be intelligently and efficiently managed.

As described, according to aspects of the present application, monitoring of fleets of batteries may be performed in a non-operational state of the batteries in some embodiments, in an operational state in some embodiments, and in both non-operational and operational states in some embodiments. The batteries may be monitored from manufacture through deployment in some embodiments, in different locations and applications. Each battery may have a sensor, examples being described further below, and the data may be collected and stored in the Cloud. A management system may be used to monitor health, location, and performance of batteries, and a manager may make decisions about what batteries to use/deploy based on the information. The management system may be used to monitor batteries prior to, during, and/or after commissioning of the batteries. A database of all the batteries and their sensed parameters may be stored.

According to an embodiment of the present application, batteries are monitored in a non-operational state. Many types of batteries are stored for extended periods after manufacture and prior to deployment. Batteries may also be stored at various stages of their lifecycle, such as between different uses of the battery. Wirelessly monitoring such batteries may allow for accurate and efficient fleet management. For example, batteries which drop below an acceptable quality criterion (e.g., of battery health and/or performance) when in storage may be identified and removed from the supply chain prior to deployment, thus saving cost and effort in deploying a non-functional battery. Characteristics of the battery which may be monitored when in an non-operational state include charge, and the condition of a housing, among others.

In contrast to monitoring batteries in an operational state, monitoring non-operational batteries comprises monitoring the batteries when not under load, according to some embodiments. The types of monitors used may accordingly be configured to monitor conditions of interest without the need to apply a load to the battery.

A central database may log information regarding individual batteries in the fleet. Monitoring analysis may be performed based on the logged data, to identify trends and characteristics of individual batteries. This knowledge may be used in decisions about battery deployment, such as whether to deploy a particular battery, the type of application in which to deploy the battery, or whether to replace a particular battery. Other actions may also be taken based on the monitoring.

FIG. 1 illustrates an example of a system for monitoring fleets of batteries, according to a non-limiting embodiment of the present application. The battery management system 100 comprises a wireless battery management system (WBMS) mesh network 102 of WBMS nodes 104a . . . 104n, a plurality of gateways 106a . . . 106n, and a data aggregation and management module 108. The data aggregation and management module 108 implements a battery lifecycle insight system (BLIS) service 110 and maintains a battery database 112.

Figure 2:
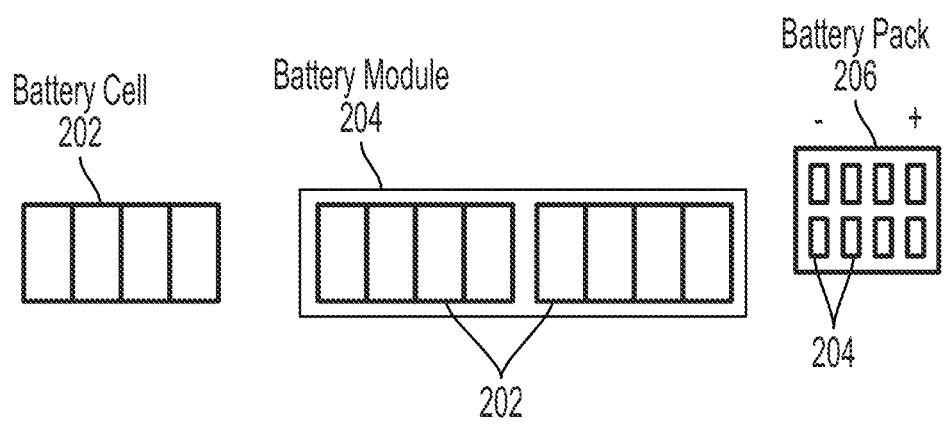
FIG. 2 illustrates a battery cell, battery module, and battery pack, according to a non-limiting embodiment of the present application.
Figure 3:
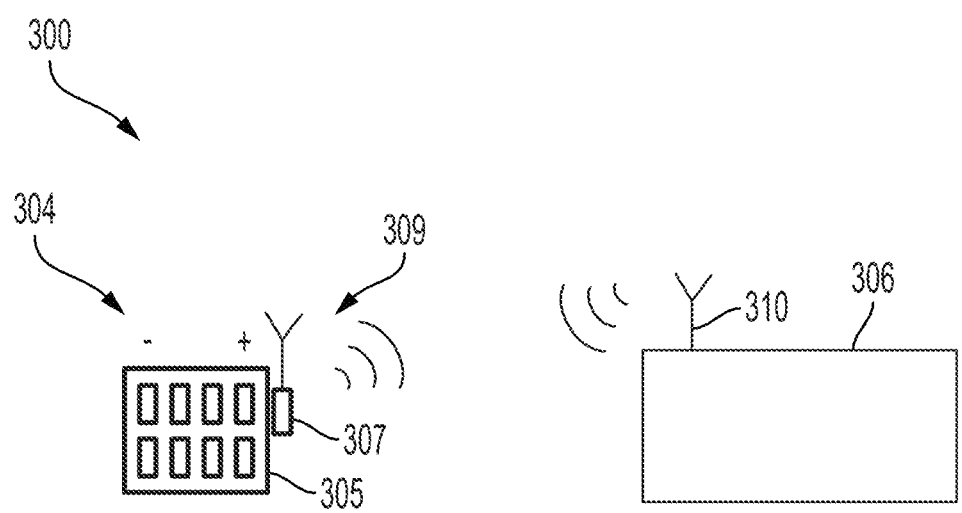
FIG. 3 illustrates a subsystem comprising a wireless battery management system (WBMS) node and a gateway, according to a non-limiting embodiment of the present application.
Figure 4:
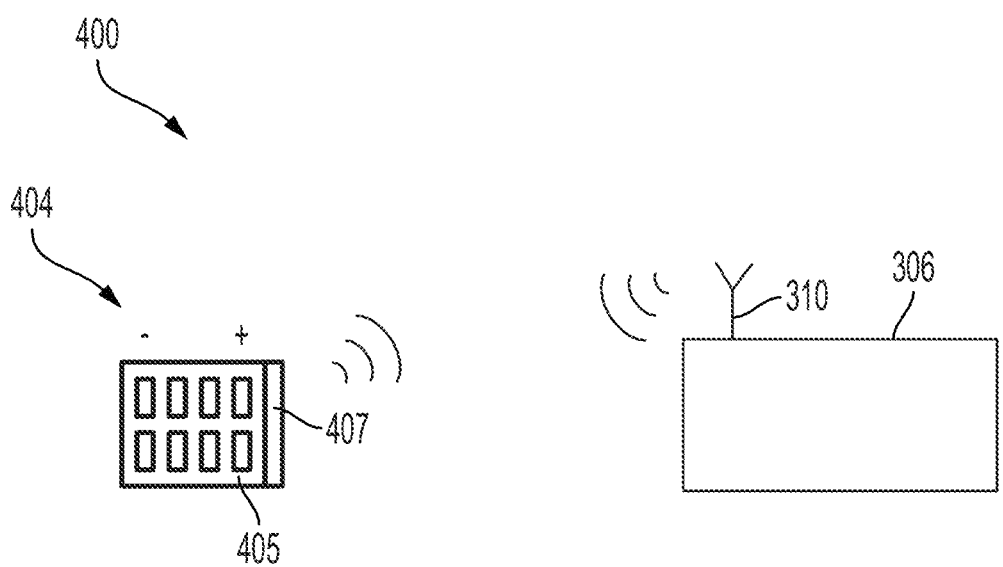
FIG. 4 illustrates a subsystem comprising a WBMS node and a gateway, according to a non-limiting embodiment of the present application.

The WBMS mesh network 102 comprises WBMS nodes 104a, 104b, 104c . . . 104n. The WBMS nodes comprise a battery and a sensor. In some embodiments, the sensor is integrated with the battery. In some embodiments, the sensor is attached to the battery, for example taking the form of a dongle. FIGS. 2-4, described further below, illustrate non-limiting examples of WBMS nodes. No matter the form, the WBMS nodes 104a . . . 104n are configured to communicate wirelessly with a gateway, as described further below. For example, they may send identifiers (battery cell ID, battery module ID, and/or battery pack ID) to the gateways, which in turn may provide them to the BLIS service 110. The BLIS service 110 is maintained at a location remote from the batteries.

Batteries, such as those that make up the WBMS nodes 104a . . . 104n, may be constructed of battery cells that are grouped into battery modules, which in turn are grouped into a battery pack. Referring to FIG. 2, battery cells 202 may be the smallest discrete unit of a battery. Different companies may manufacture different types of battery cells, with different chemical compositions. Companies may have proprietary battery cell compositions. Battery cells 202 may be grouped into a battery module 204. Battery modules 204 may include any suitable number of battery cells 202. In the non-limiting example of FIG. 2, the battery module 204 includes two battery cells 202. However, the aspects described herein as utilizing battery modules are not limited to the modules including any specific number of battery cells. A battery pack 206 comprises a plurality of battery modules 204. In the non-limiting example shown, the battery pack 206 comprises eight battery modules 204. However, the aspects described herein as utilizing battery packs are not limited to the packs including any specific number of battery modules. As illustrated in FIGS. 3 and 4, described further below, the WBMS nodes additionally include a sensor and wireless communication mechanism.

Returning to FIG. 1, any suitable number of WBMS nodes 104a . . . 104n may be part of the battery management system 100. The WBMS nodes 104a . . . 104n make up a fleet of batteries in at least some embodiments. The fleet may include tens of batteries, hundreds of batteries, or thousands of batteries, as non-limiting examples. The WBMS nodes, or at least some of them, may be configured to communicate with each other, thus forming a mesh network. In this manner, data may be shared between WBMS nodes. For example, battery data from one WBMS node may be passed to another, from which it may be passed to a gateway. Also, instructions or software updates may be passed from a gateway to one WBMS node, and then from that WBMS node to another WBMS node of the mesh network.

The WBMS nodes $104a \ldots 104n$ may be different types of batteries, including batteries made by different manufacturers. In some embodiments, the batteries may all be of the same type, for example if a manufacturer is implementing the battery management system. However, the battery management system 100 may be implemented by entities other than manufacturers, who may use it to monitor fleets of batteries of different types. For example, a distributor who distributes batteries from many different manufacturers may implement the battery management system 100 to monitor and manage batteries it distributes for the different manufacturers.

The WBMS nodes $104a \ldots 104n$ may be at any suitable locations, and in some situations the locations may change. Some of the WBMS nodes may be co-located, for example in a warehouse or other storage facility, while others may be positioned at separate locations. For example, some of the WBMS nodes may represent batteries deployed in the field, for example in electric vehicles, ships, or planes, and therefore the location may change. Also, the battery management system 100 may be used to monitor WBMS nodes when in transit, for example in shipping containers.

The WBMS nodes $104a \ldots 104n$ may be in various states of usage, as will be described further below in greater detail. As has been described above, monitoring of batteries in non-operational states may be desirable and provided by the battery management system 100. One or more of the WBMS nodes $104a \ldots 104n$ may be in a non-operational state. For example, one or more of the WBMS nodes $104a \ldots 104n$ may be in storage, or being transported from one location to another. Batteries often spend a significant amount of time in non-use before being deployed, or between different deployments. During such times, the batteries may degrade. Thus, monitoring their state of health only when in use risks losing valuable information and could result in damage to property or people, or decisions to deploy batteries that are not suitable for a particular application or for any application, thus requiring replacement. Time and money may be lost as a result. Accordingly, the inventors have recognized the importance of monitoring battery fleets even when those batteries are not in use.

The gateways $106a \ldots 106n$ serve to aggregate data from multiple WBMS nodes and provide the data to the data aggregation and management module 108. The gateways are wirelessly enabled, to allow for wireless communication with the WBMS nodes, and may communicate wirelessly or through a wired network with the data aggregation and management module 108. The gateways $106a \ldots 106n$ may be positioned at any suitable locations to collect data from the WBMS nodes. For example, a warehouse storing batteries may have one or more gateways $106a \ldots 106n$. A manufacturing facility may have one or more gateways $106a \ldots 106n$.

Any suitable number of gateways $106a \ldots 106n$ may be provided for monitoring the fleet of batteries represented by the WBMS nodes $104a \ldots 104n$. Tens of gateways, hundreds of gateways, or thousands of gateways may be provided. Multiple gateways may be placed at a same location, or within the same vicinity, such as within a same building, room, or transportation vehicle. Each gateway may aggregate data from a plurality of the WBMS nodes $104a \ldots 104n$, such as from tens, hundreds, or thousands of WBMS nodes.

The gateways $106a \ldots 106n$ may communicate with the WBMS nodes $104a \ldots 104n$ and the data aggregation and management module 108 using any suitable protocol. In some embodiments, the gateways may be 4G and/or 5G enabled, and may communicate according to the wireless 4G and/or 5G standards. However, the aspects of the present application involving gateways to communicate with WBMS nodes and a data aggregation and management module are not limited to communicating according to any particular protocol. FIGS. 3 and 4 illustrate non-limiting examples of communication between a WBMS node and a gateway.

FIG. 3 illustrates a subsystem 300 comprising a WBMS node 304 and a gateway 306. The WBMS node 304 comprises a battery pack 305 and a dongle 307 including an antenna 309. The battery pack 305 may be of the types described previously herein, or may be any other battery pack for which it is desired to monitor a condition of the battery pack. The dongle 307 may include a sensor configured to sense a condition of the battery pack 305. For example, the dongle may include a sensor configured to sense voltage, current, state of charge, temperature chemical composition, or any other condition of the battery pack for which it is desired to collect data. In some embodiments, the sensor may include a spectrometer, ultrasound imager, or RADAR imager. The dongle may be attached to the battery pack 305 in any suitable manner, such as being clipped to the battery terminals, screwed to a housing of the battery pack, or connected in any other manner. The dongle may be removable, so that it can attached to a different battery pack when desired. The dongle may allow for delivery of more sophisticated measurement and sensing techniques suitable for warehouse and transport storage, that may be too expensive to integrate into every battery. A non-limiting example of such measurement and sending techniques may include impedance spectroscopy with edge processing/modelling. The antenna 309, which may be part of the dongle 307, including being integrated in a package of the dongle, may communicate wirelessly with the gateway 306.

The gateway 306 may be the type of gateway described previously in connection with FIG. 1. The gateway 306 may include an antenna 310. The antenna 310 may send signals to and receive signals from the WBMS node 304. Specifically, signals may be communicated wirelessly between the antenna 309 and the antenna 310.

FIG. 4 illustrates an alternative subsystem to that of FIG. 3. FIG. 4 illustrates a subsystem 400 comprising a WBMS node 404 and the gateway 306. The gateway 306 has been described previously in connection with FIG. 3, and thus is not described in detail now. The WBMS node 404 differs from the WBMS node 304 in that it includes a battery pack 405 having an integrated sensor 407. The integrated sensor 407 may be any of the types of sensors described previously herein. The integrated sensor 407 may include an integrated antenna for communicating wirelessly with the antenna 310 of the gateway 306.

Battery fleets may include multiple types of WBMS nodes. For example a battery fleet may include WBMS nodes 304 and WBMS nodes 404. Gateways may be configured to communicate with multiple such types of WBMS nodes.

It should be appreciated from FIGS. 3 and 4 that according to an aspect of the present application, a wireless battery monitor is provided. The wireless battery monitor may be affixed to a battery in an operational or non-operational state, and may collect information about desired characteristics of the battery. In some embodiments, the wireless battery monitor may be a dongle. In other embodiments, the wireless sensor is an integrated part of the battery. The type of monitoring done by the wireless sensor may be controlled wirelessly, and may change over time, as described further below.

In some embodiments, wireless enabled batteries may have all the functionality already included in the battery and the battery monitoring service may select the right edge models, optimize the edge measurement techniques and constantly refine the existing models. Such operation may be particularly beneficial if the data being analyzed includes data from earlier parts of the lifecycle, like battery formation. The same techniques may be used in the separate dongle embodiment as well.

Returning to FIG. 1, the battery management system 100 comprises the data aggregation and management module 108. As described previously, the data aggregation and management module 108 implements a BLIS service 110 and maintains a battery database 112. The BLIS service 110, which may be executed in the Cloud or in some embodiments may alternatively be executed on a private network, or may be implemented in other manners, may serve as an aggregation point for data collected from the WBMS nodes, may provide a user interface, may maintain digital twins of the monitored batteries, may serve as a marketplace for batteries, and may serve as a source of development and deployment of battery models. Those functions are described in further detail below. The battery database 112 may store data of the type collected from the WBMS nodes, as well as additional data that may be useful in the performance of the functions handled by the BLIS Cloud service 110. For example, as shown in FIG. 1, the battery database 112 may include tables 114 storing information such as a battery pack identification ("pack ID"), a battery module identification ("module ID"), battery cell identification ("cell ID"), voltage, current, temperature, and date information. For example, each measurement of voltage, current, and/or temperature may be datestamped. Those measurements may be taken at various times, and information related to the measurements over time may be stored in the battery database 112. Additional or alternative information may be maintained as desired. Such information may be sent to the BLIS service 110 by the WBMS nodes (e.g., WBMS nodes 104a . . . 104n).

Figure 5:
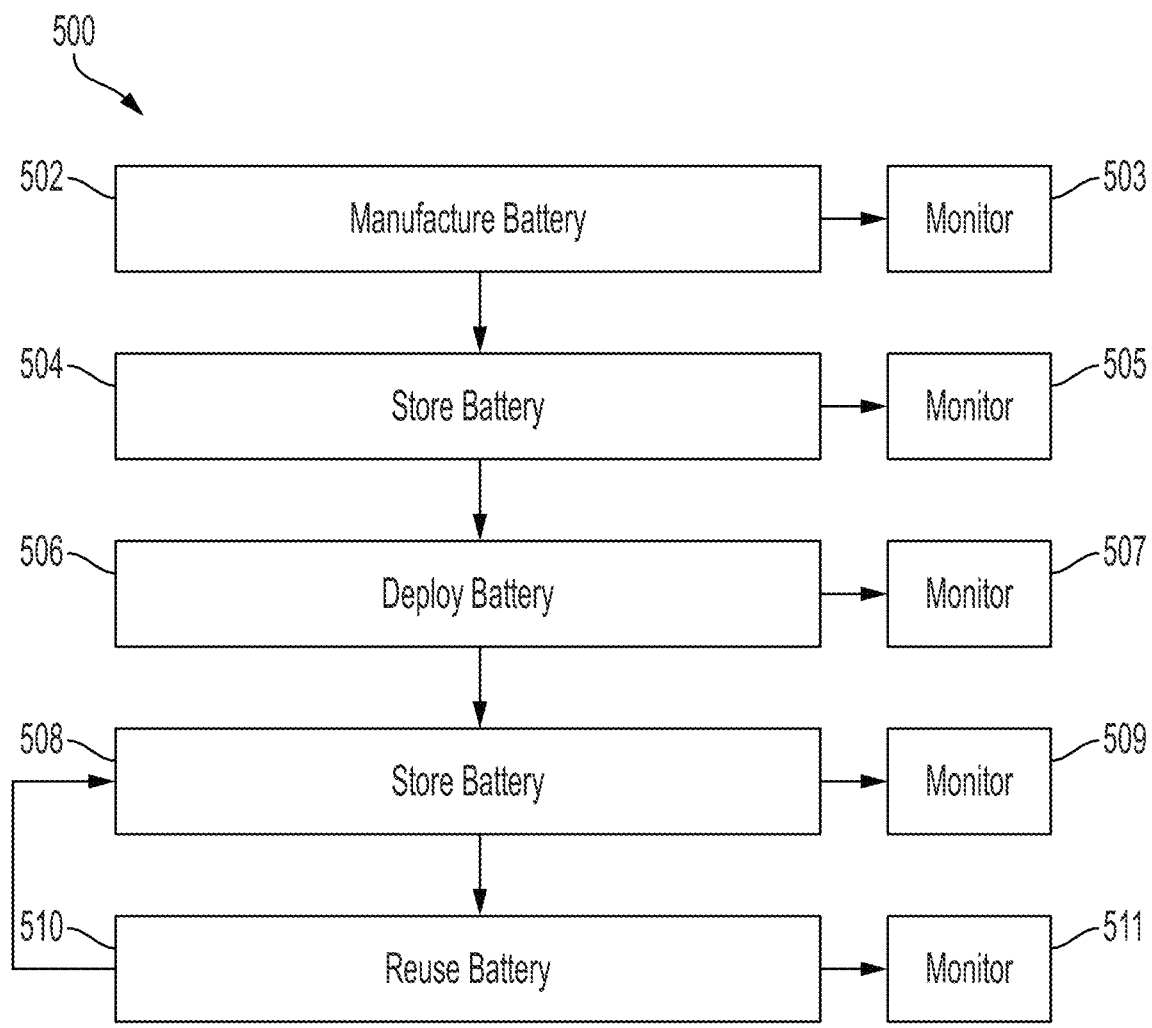
FIG. 5 illustrates a method for monitoring batteries throughout their lifecycle.

As has been described the battery management system may be used to monitor batteries through any and all stages of their lifecycle. FIG. 5 illustrates a non-limiting example. The method 500 illustrates monitoring of a battery cell, module, or pack through its lifecycle. As shown at stage 502, the battery may be manufactured. At this stage, monitoring 503 may be performed. The monitoring may include detecting SOH, SOC, or any other desirable parameter, including any of those described previously herein.

At stage 504 the battery may be stored in a storage facility. For example, the battery may be put in a warehouse for subsequent deployment. At this stage, monitoring 505 may occur. As with the other monitoring stages of method 500, monitoring stage 507 may entail monitoring any parameter of interest.

Figure 6:
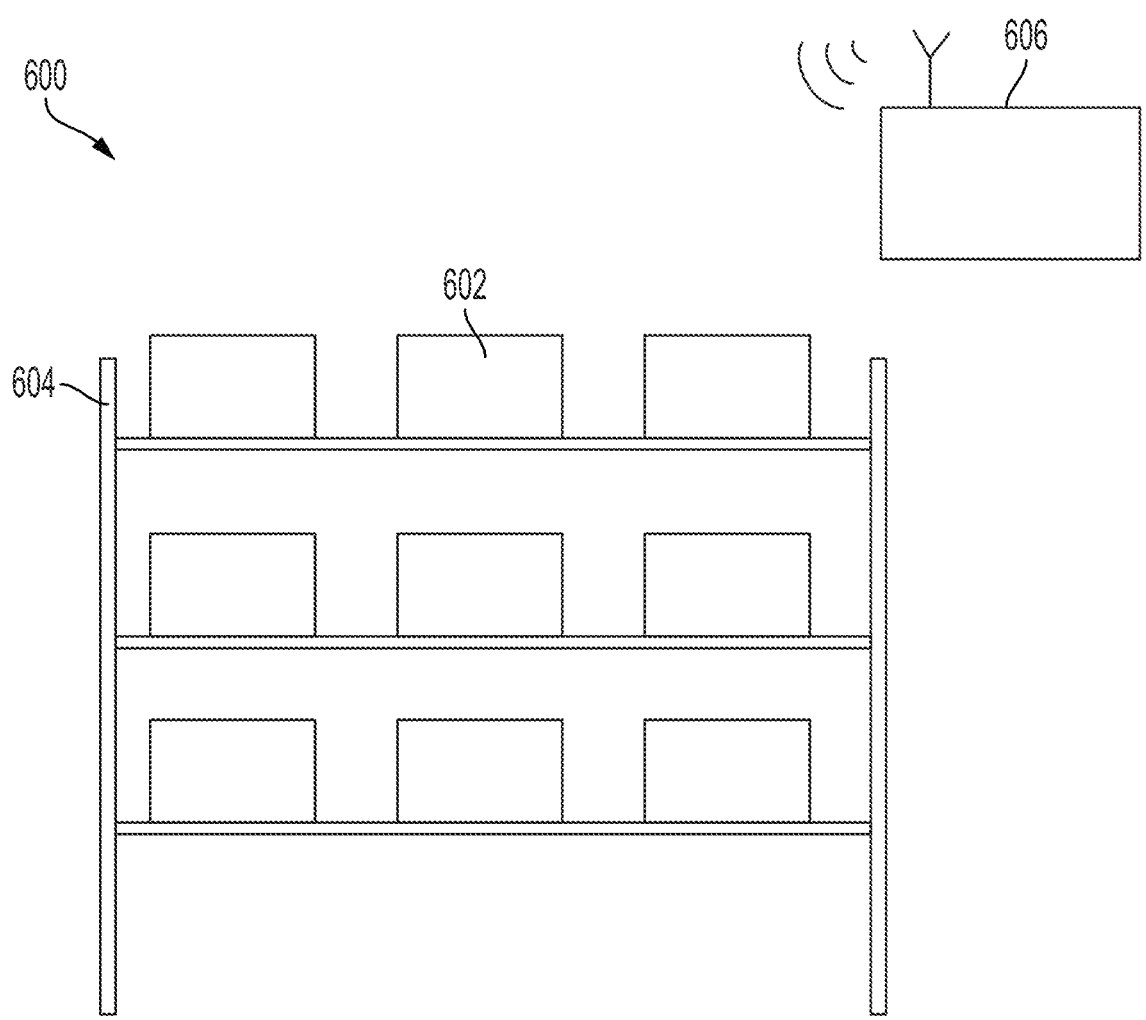
FIG. 6 illustrates an example of a configuration for monitoring a battery in storage, according to a non-limiting example of the present application.

An example of a configuration for monitoring a battery in storage is shown in FIG. 6. The monitoring setup 600 comprises a plurality of batteries 602 on a shelf 604, and a gateway 606. The battery 602 may be a WBMS node, such as any of the WBMS nodes described previously herein. The shelf 604 may be in a warehouse, or other storage location. Any number of batteries 602 may be stored on the shelf, waiting for deployment. The gateway 606 may be any of the types of gateways described previously herein. The gateway may communicate wirelessly with all the batteries on the shelf 604, or with a subset of them, collecting data from the batteries which may be passed to a BLIS service, such as described previously in connection with FIG. 1. Such monitoring and data collection may occur at any suitable time interval.

Returning to FIG. 5, at stage 506, the battery may be deployed in its first life. For example, the battery may be commissioned for use in a ship, or an electric vehicle. At this stage, monitoring 507 may be performed. As with the other monitoring stages of method 500, monitoring stage 507 may entail monitoring any parameter of interest.

After deployment at stage 506, the battery may be decommissioned and placed back in storage at stage 508. For example, the battery may be returned to a warehouse or other storage facility. At this stage, monitoring 509 may occur. As with the other monitoring stages of method 500, monitoring stage 507 may entail monitoring any parameter of interest.

At stage 510, the battery may be reused, for example in its second life. For example, the battery may be commissioned for a new use from that of stage 506. At this stage, monitoring 511 may be performed. As with the other monitoring stages of method 500, monitoring stage 511 may entail monitoring any parameter of interest.

The method 500 may involve iterating between use of the battery and storage of the battery, as shown by the arrow from stage 510 to 508. Batteries may have multiple lives, being repurposed multiple times. The battery management system described herein may monitoring the batteries throughout such a lifecycle.

Tamper Proof Audit Trail

Figure 7:
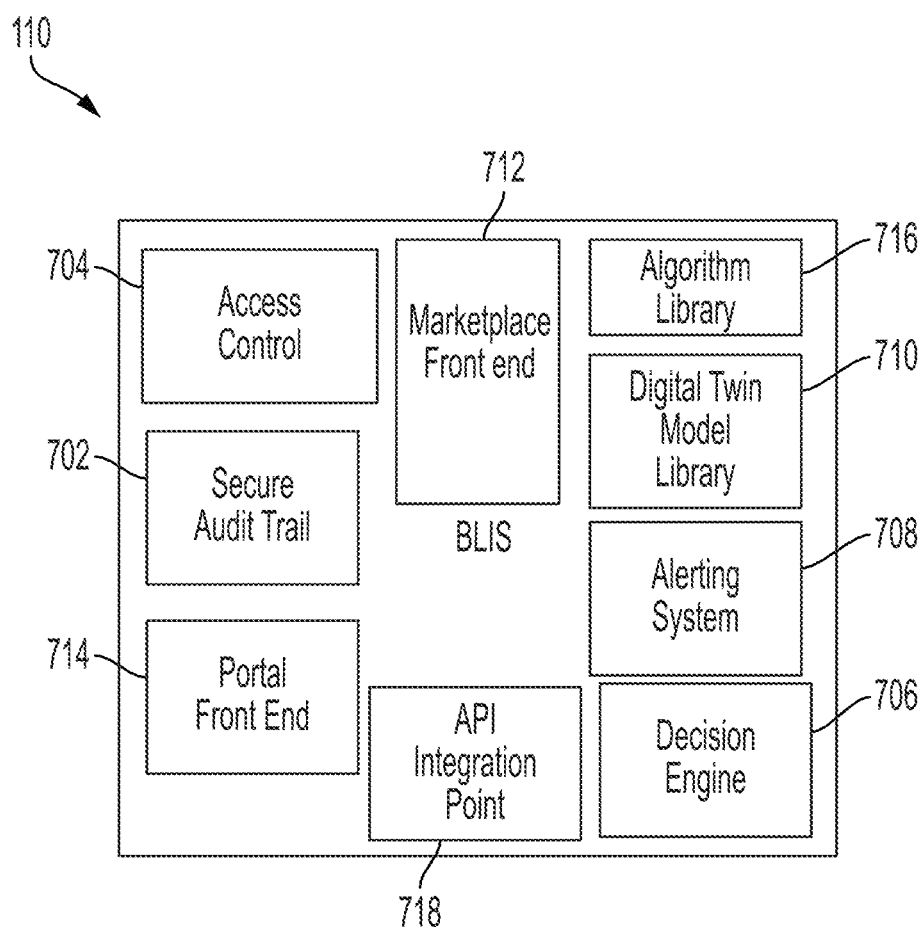
FIG. 7 illustrates functional modules of a battery insight lifecycle system service, according to a non-limiting embodiment of the present application.

According to an aspect of the present application, battery monitoring data, such as that collected from a method like method 500, may be stored in a tamper proof audit trail. For example, the data stored by the battery management system 100, or at least some of the data, may be stored in a tamper proof audit trail. FIG. 7 illustrates a non-limiting example of functional blocks of the BLIS service 110. As shown, the BLIS service 110 may include a secure audit trail 702. Every time a measurement is made for a battery pack, module or cell, it may be stored in the battery database 112 and digitally signed or hashed. It may also be added to a blockchain. The consensus mechanism for the blockchain may be server based (e.g., distributed across multiple Cloud services). The blockchain or trusted database will over time build out a trusted ledger containing the state of the network along with the measurements, state of health (SOH), state of charge (SOC), algorithm, battery pack, battery module and battery cell ID for each monitored entity in the network. This trusted database may be used to create digital twins and augment these digital twins in n'th life scenarios, described further below. The trusted database entries may be secured through a combination of cryptographic hash functions and digital signatures for which the keys are stored in secure hardware modules.

As has been described, the BLIS service 110 may perform various types of analysis on the aggregated data. Various examples are now described. However, it should be appreciated that the battery management system 100 may perform alternative or additional analyses than those described. For example, a subset of the analyses now described may be implemented. The manager of the BLIS service 110 may choose which analyses to perform. In some embodiments, the analyses may change over time.

Identifying Assets and Mutual Authentication

The BLIS service 110 may include an access control function 704 to permit access only to authorized WBMS nodes. According to an embodiment of the present application, one or more, and in some embodiments each, battery packs, modules or cells contains a WBMS component that includes a unique identifier. This allows for unique identification of the pack, its composite modules and cells based on the WBMS node. The identifier is cryptographically tied to the asset (pack, module, or cell) through a digital signature issued at the time of manufacture the WBMS node. The WBMS node also includes a set of cryptographic primitives, including public key cryptography, symmetric encryption algorithms, hash functions and secure key storage and secure protocol implementations. The public keys may be bound to the device identifier through a digital signature or a public key certificate to form a trusted identity. The BLIS service 110 may use such information to verify the trusted identity by requesting the battery pack, module or cell to calculate a digital signature and using the public key certificate to validate the signature and establish a chain of trust. The WBMS node also contains a trusted key store that contains a root certificate or a trusted public key that can be used to authenticate the BLIS service. The BLIS service 110 will authenticate itself through a digital signature on a challenge issued by the WBMS nodes. This will establish an authentication context that will only be valid for a limited time that can be configured by a customer, or other user of the BLIS service 110. Measurement data can be optionally encrypted before transmission to the BLIS service 110 following a key exchange protocol so that only the BLIS service 110 can decrypt and use the reported data.

Battery Chemistry Fingerprinting

According to an aspect of the present application, the battery management system may be used for battery chemistry fingerprinting. The customer or other user of the battery management system 100 may configure the BLIS service 110 for a specific battery chemistry, which in turn will allow the BLIS service 110 to recommend a set of optimal battery health algorithms for a specific battery chemistry. In addition, the BLIS service 110 may fingerprint a battery and deduce the chemistry by observing a series of simple voltage and current measurements over time, or by deploying more advanced measurement techniques like impedance spectroscopy or other electrical and chemical signatures to identify the battery and automatically select and suggest the optimal battery health algorithms. This will enable customers to mix different battery chemistries in their deployments, without having to explicitly configure it in the BLIS. In some embodiments, customers will have a fail-safe override option to ensure the chemistries of their choice are selected.

Fleet Benchmarking Anomaly Detection Algorithms

According to an aspect of the present application, the battery management system may be used to detect anomalies of batteries within a fleet being monitored. For example, the BLIS service 110 may include a decision engine 706 configured to receive the monitored data and analyze it for anomalies. The BLIS service 110 will deploy a set of anomaly detection algorithms that use a combination of statistical and machine learning techniques to identify outliers in terms of battery health or other parameters of interest. As an example, battery health may be compared across a fleet of batteries and outliers may be expected, such as those above and below a threshold. For example, a first threshold may be the top 5% and a second threshold may be the bottom 5%. Those batteries testing within the top 5% for battery health may be graded as premium grade. Those batteries testing within the bottom 5% may be re-worked, or designated for end-of-life. Other thresholds may be used, and other parameters besides battery health may be used in such analyses.

According to some embodiments, machine learning (ML) techniques are used to classify batteries into different groups. Such machine learning techniques may leverage information of the present battery population as well as historic populations to assess the health of a current batch of batteries. These algorithms will be, in some embodiments, pluggable, and may be augmented or replaced by customer specific or third party provided algorithms. They will be secured similar to other pluggable modules using digital signatures.

Thus, according to an embodiment of the present application, the battery management system 100 is used to perform anomaly detection. The BLIS service 110 runs one or more algorithms to detect anomalous measurements of any of the batteries within the fleet being monitored. Such anomalous measurements give rise to an alert being generated for a manager or operator of the battery management system 100. The manager may evaluate the alert and take appropriate action. The analysis may be done using machine learning algorithms executed by the BLIS service 110 in some embodiments.

Alarming System

According to an aspect of the present application, the BLIS service may analyze detected anomalies and determine an appropriate action, such as issuing an alert or alarm. For example, in some embodiments, once the system detects an anomaly using the decision engine 706, it will apply algorithms to determine the severity and level of escalation. The algorithms and their threshold levels may be automatically calibrated against the battery fleet data as described with respect to anomaly detection, but additional criteria may be added to increase or decrease severity levels. Customers of the BLIS service may develop their own eventing/alarming algorithms, but may also leverage or configure those included by default in the BLIS service. The eventing algorithms may be carried out by an alerting system 708, and may be further refined to take into account different battery chemistries as well as historical data about specific batteries (e.g., combining the measurement with battery formation information to generate cell specific alerts where a condition may be dangerous for a given battery cell even if only marginal for most battery cells).

In some embodiments, a tiered alarming system may be used with events being classified into a number of tiers, ranging from information only to immediately actionable. The eventing system may trigger alerts and may be integrated with a range of eventing systems such as e-mail, SMS and application notification systems. The alarm/eventing system may also maintain a queue of events, in case events cannot be generated. A record of events sent will be recorded as part of the trusted audit trail to provide records of when exceptional behavior has been observed.

Figure 8:
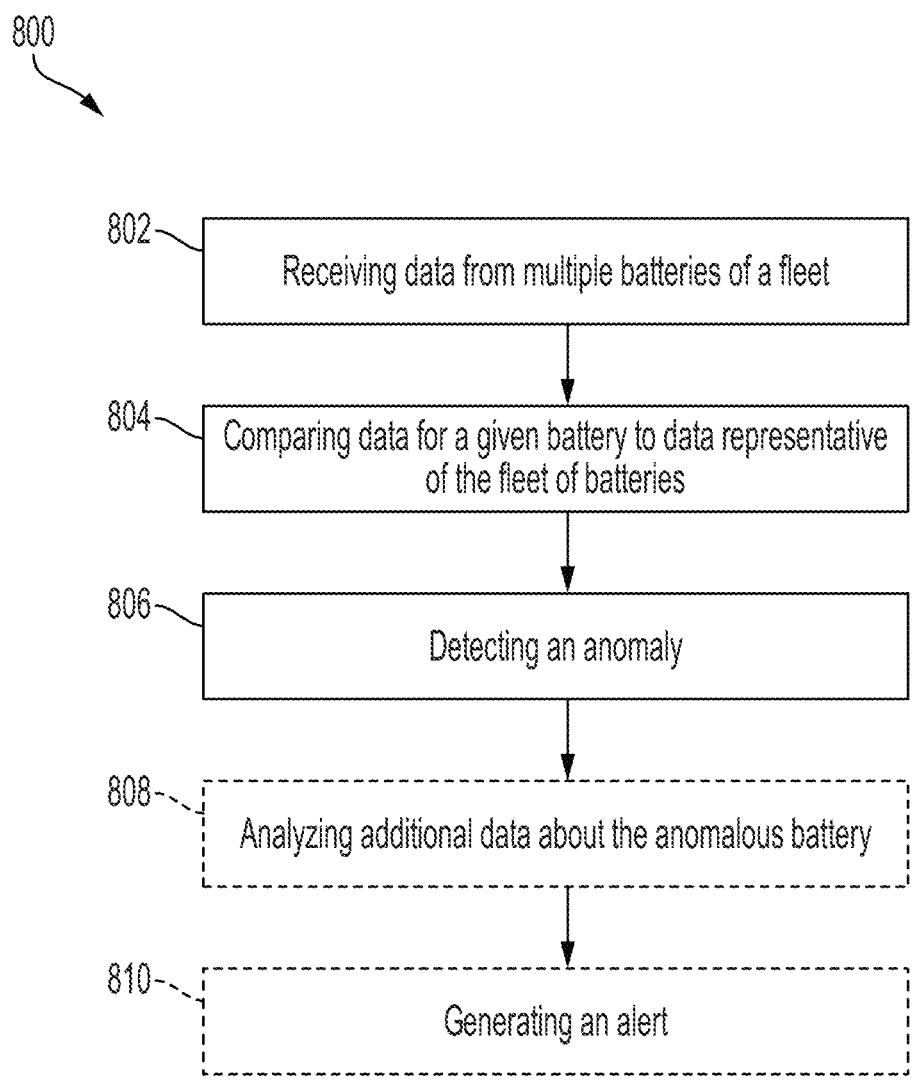
FIG. 8 illustrates an example of a method that may be performed by a battery management system combining anomaly detection and alerting.

FIG. 8 illustrates an example of a method that may be performed by a battery management system combining anomaly detection and alerting. The method 800 begins at stage 802 with the BLIS service receiving data from multiple batteries of a fleet. The data may be voltage data, current data, temperature data, or any other data being aggregated by the BLIS service.

At stage 804, the method 800 involves comparing data for a given battery to data representative of the fleet of batteries. For example, the SOC of a particular battery may be compared to representative data of the SOC of the fleet of batteries. In some embodiments, stage 804 comprises comparing data for a given battery to a threshold value.

At stage 806, the method 800 involves detecting an anomaly relating to the battery of interest. The anomaly may entail the battery data being higher than a threshold, or lower than a threshold, as non-limiting examples.

The method may involve an optional stage 808, at which additional data about the anomalous battery is analyzed. The box for stage 808 is dashed to represent the optional nature of the stage. The additional data that may be analyzed may be any suitable data for verifying the anomalous results of state 806, or determining a level of severity of the anomaly.

At stage 810, which is also optional, an alert may be generated. The alert may be an alert generated to a user of the BLIS service, or to the manager of the BLIS service. The alert may be visual, audible, or both.

Methods of detecting anomalies and acting on the detection of the anomalies may differ from that shown in FIG. 8. Thus, it should be appreciated that the method 800 is a non-limiting example.

Digital Twins

In some embodiments, the data gathered by the BLIS service will be used as inputs to generate a digital twin for a given battery cell, module, or pack. That is, according to some embodiments, digital twins may be maintained for a given battery cell, battery module or battery pack. The digital twin model library 710 of the BLIS service 110 may handle this. The digital twin can be composed of multiple models through a "Digital Twin Composer" by the customer, by a third party expert, or by an expert system integrated into the BLIS service. The Digital Twin Composer, upon identification of the battery chemistry, may recommend multiple models to use in the creation of the digital twin. The battery chemistry can be identified through user input, looking up a specific batch number (including formation history) or through inspection of the measured data (e.g., observing the voltage, current and temperature of a given battery cell, module, or pack, or performing impedance spectroscopy or ultrasound analysis for example). In some embodiments, the BLIS service will maintain a digital twin for each asset and retain the parameters and model even after the asset is no longer tracked in the BLIS service. This information can then be accessed at later lifecycle events to refine and update the digital twin. The digital twin can be augmented throughout its life by adding and refining models (e.g., updating one of the existing models, or adding an additional model). Every time a change to the models and parameters is made, it may be written to a trusted audit log or blockchain entry.

Simplified versions of the digital twin may be derived that can run locally at the edge node (the WBMS node), sensor or dongle in an energy efficient way. A digital twin at the edge node, sensor or dongle will be used to make local predictions on the SOH/SOC, which in some embodiments may remove the need for constant wireless communication with the gateway or BLIS service, cutting down on battery usage, which is especially valuable in warehousing scenarios. Effectively the BLIS service will offload some of the compute of the digital twin to the edge (the WBMS node). If the local predictions deviate from the state measured at the edge node, an alarm may be, and in at least some embodiments will be, raised and the buffered data of all measurements since the previous connection to the BLIS service will be sent up to the BLIS service for deeper inspection and more robust modeling in a high fidelity digital twin. The model may be updated, or an alert may be raised as a result. The updated model or an updated set of parameters (including weights for a multi-layer neural network) may be re-distributed back to the edge node, sensor or dongle.

Model Marketplace

In some embodiments, the BLIS service may provide a marketplace of models from which digital twins can be created. The BLIS service 110 may include a marketplace front end 712 as shown in FIG. 7. In some embodiments, the marketplace may include a database storing the models. Different users of the BLIS service may be allowed to access the models stored in the database. For example, the BLIS service may include a server that hosts a database storing the models. Users of the BLIS service may have access to the models stored in the database. As an example, the marketplace may include an interface (e.g., a website) provided by the BLIS service via which users can access models stored in the database.

The digital twins may be composed of one or more models. Models may be optimized for different battery chemistries and input parameters. Parameters may include voltage, current and temperature, but may be extended to include results from impedance spectroscopy, ultrasound analysis or other active or passive measurements. The BLIS service may include a set of generic models for popular battery chemistries. In some embodiments, customers may alternatively or additionally create and upload their own models to the BLIS service via the marketplace front end 712. The models will be encapsulated within a library with a well-defined interface and will be digitally signed to ensure integrity. Models will execute in sandboxed environments to prevent them from interfering with other models while also helping to protect the model provider's intellectual property (IP) by treating the model as a black box. In addition to customer supplied models, the BLIS service in some embodiments permits entities (e.g., companies) that specialize in model creation to develop models and sets of models that can be used for digital twin creation, along with recommended combinations of models for specific battery chemistries. Customers and third party suppliers may offer their models and model combinations for use within the BLIS service through the digital marketplace accessible through the marketplace front end 712. Customers may try new models and model combinations, benchmark them against their own and license the use of these models from third parties or from each other. Third parties and customers may optionally to control access to their models and may choose to only make it visible to themselves or selected customers. Third parties may include expert consulting houses, universities or battery manufacturers who are looking to provide models for their batteries in the BLIS service. The model marketplace will contain recommendation engines, search engines, reviews and detailed descriptions of the models. It may support a variety of pricing and licensing options that can be expressed in a markup language, captured through a graphical user interface, when the customer submits their model for inclusion. The models include not only the algorithmic simulation of a model but may also include metadata about how the measurements need to be made (for example, the excitation pulses, waveforms and frequencies to be used by an impedance spectroscopy measurement system). Customers may see the pre-requisites for specific models (e.g., ultrasound sensors). In addition to including list of models, customers may optionally connect with model providers to provide feedback or commissions custom models.

Battery Characterization and Model Creation

According to an aspect of the present application, the BLIS service includes a set of tools and capabilities to characterize batteries and quickly create models from those characterizations. The data obtained from characterization will be uploaded through the BLIS portal front end 714 and a model may be derived from this data using a variety of techniques, including lookup tables, curve fitting, artificial intelligence (AI) and machine learning (ML) techniques. In some embodiments, the battery model creator produces a model that is compliant with the interfaces supported by the BLIS service. The model creator tracks additional data captured during operation for each battery modeled and automatically uses this data to keep refining the overall model, creating a self-learning, auto-adaptive battery model that is continuously refined as more data is gathered.

In some embodiments, a model may include a battery simulation along with metadata about the battery. For example, metadata may include instructions about how to use the model, how to take measurements, and other information about the model. The BLIS service may provide generic models for different battery types (e.g., different battery chemistries). In some embodiments, the BLIS service allows users to provide custom developed models. The BLIS service may make custom developed models available to other users of the BLIS. The BLIS may allow users to combine different models provided by the BLIS to create new models for use in creating digital twins. In some embodiments, the BLIS service may allow users to experiment with models and model combinations. Users may be able to run simulations on the models. In some embodiments, the BLIS service may secure access to models. For example, the BLIS service may restrict access to models by encrypting the models, and requiring a secure login to access certain models. In some embodiments, the BLIS service may provide a graphical user interface (GUI) via which users can search for, create, submit, and/or modify models. The BLIS service may further provide a search engine for searching through available models provided by the BLIS. In some embodiments, the BLIS service may include a recommendation engine to recommend models to users. The BLIS service may receive information from a user (e.g., about a battery), and determine a set of recommended models to provide the user.

Distributing Updates

According to an aspect of the technology, the type of monitoring being performed by a sensor of a WBMS node may be updated based on calculations done remotely, for example in the Cloud. For instance, many different batteries may be monitored, and the collected data sent to the Cloud for processing, as has been described. Based on the data, a determination may be made that the sensors should be using different algorithms, and so updated algorithms may be transmitted from the Cloud to the sensors on the batteries to update their monitoring. For instance, the sensor may initially run one type of sensing algorithm, but later be updated to run a different type of algorithm. In some embodiments, an algorithm may be updated by updating a parameter set, type of algorithm, and/or battery model used by the sensor. For example, the sensor may: (1) initially run an algorithm using a first parameter set, first type of algorithm, and/or first battery model; and (2) later be updated to use a second parameter set, second type of algorithm, and/or second battery model.

According to an embodiment of the present application, wireless battery management system (WBMS) enabled nodes (battery packs, modules, cells) are connected to and mutually authenticated to a Battery Lifecycle Insight System (BLIS). The BLIS will verify the version and set of edge algorithms being run by the WBMS node and then update the WBMS node to the correct firmware version, set the WBMS nodes into the correct networking mode, enable inventory mode for local storage of data at the WBMS node (e.g., for retrieval by the BLIS), enable encryption of measurement data (optional), update the edge algorithms and waveforms that may be used for more sophisticated measurement techniques such as impedance spectroscopy and then enable those algorithms and waveforms and measurement techniques that the customer has licensed. The updates may include changes to the code that executes at the edge (including models), parameters used to configure the edge node (including models, communication modes and operating modes) as well as activating specific features at the edge node (e.g. impedance spectroscopy is enabled only if the customer licenses/pays for a specific measurement modality). All updates (firmware, settings, waveforms, parameters) are packaged in a common data structure that is serialized and digitally signed by the BLIS to ensure that the updates are authentic and come from an authorized BLIS server. The BLIS service may maintain multiple signature keys used on a per deployment or per customer basis to further enhance security.

WBMS nodes may measure temperature, voltage, and/or current in some embodiments. In some embodiments, WBMS nodes may be enhanced to measure additional modalities beyond temperature, voltage and current. For example the edge node may be enabled to engage in impedance spectroscopy to provide more sophisticated diagnostics. The BLIS may control the excitation frequencies and waveforms in some embodiments. For example, the BLIS may control the excitation frequencies and waveforms for impedance spectroscopy and/or other measurement modalities used by the BLIS. The edge node may interpret the results themselves, or pass it back to the BLIS service for interpretation. The waveforms and frequencies will be varied by battery chemistry and there may be multiple waveform and frequency variations for a given battery chemistry. The combined result of this may be used to infer deeper understanding of the battery health. System users may develop their own waveforms and frequency maps and this may be provided as plug-ins to the BLIS service which then administers and distributes this on-behalf of a customer using the same mechanisms as described further below with respect to pluggable algorithms. The system manager may continuously update and augment the waveforms and frequency maps. As new measurements are developed, support may be added for these measurements in the BLIS service (e.g. ultrasound or RADAR imaging of the battery cells).

Offline Operation

According to an aspect of the present application, the WBMS nodes may log data when offline. In cases where a WBMS node cannot connect to the BLIS service or cannot connect with a gateway, it may in some embodiments continue to take measurements and apply a time stamp to those measurements using a realtime clock that is periodically synchronized when the edge node can connect with the system. The WBMS enabled node may store these measurements locally or forward them to a gateway if that is available. The gateway may queue the messages until the BLIS service becomes available and then send the measurements up to BLIS.

Pluggable Algorithms

The BLIS service may maintain an algorithm 716 library of different SOH, SOC and other battery related algorithms. The BLIS service may include a set of baseline algorithms. These algorithms may be replaced by custom algorithms developed by the customer or by a provider of their choice. The BLIS service may accept multiple algorithms for a single battery chemistry and allow the customer to select one or more of these algorithms to represent the battery health. Plug-in algorithms may run in a secure container on the service and may be sandboxed to prevent it from interfering with other algorithms or other aspects of the operation of the BLIS. In some embodiments, plug-in algorithms will only run in the BLIS service if they are digitally signed by the manager of the BLIS service as an added layer of protection. Customers may develop their own SOH and SOC and other battery health measurement algorithms using an SDK and quality control test suite setting a minimum quality bar. Customers will be able to limit the visibility of plug-ins they provide to their own deployments and these algorithms will not be visible to other customers.

Additional Measurements

WBMS nodes may be enhanced to measure additional modalities beyond temperature, voltage and current. For example the edge node may be enabled to engage in impedance spectroscopy to provide more sophisticated diagnostics. The BLIS service may control the excitation frequencies and waveforms. The WBMS node may interpret the results themselves, or pass it back to the BLIS service for interpretation. The waveforms and frequencies may vary by battery chemistry, form factor or other unique characteristics of the battery and there may be multiple waveform and frequency variations for a given battery chemistry. The combined result of this may be used to infer a deeper understanding of the battery health. Customers may develop their own waveforms and frequency maps and this may be provided as plug-ins to the BLIS service as described above. The manager of the BLIS service may continuously update and augment the waveforms and frequency maps. As new measurements are developed, such as ultrasound or RADAR imaging of the battery cells, the BLIS service may support such measurements.

Localization

In addition to measuring, monitoring and maintaining models that can be composed as digital twins, the BLIS service will also be able to deliver additional services such as localization. Batteries stored on shelves may be located using a set of matched barcodes that are scanned whenever the battery is placed on a shelf or removed from a shelf. The BLIS service may activate and configure the WBMS nodes and mesh network to enter "localization" mode. In this mode, the BLIS service may use the signal from the WBMS nodes to calculate the position of the battery pack, modules and cells relative to each other using triangulation techniques. These relative locations can then be turned into absolute positions by mapping them to gateways with known positions, either entered manually or derived from a global positioning system. The location information may be combined with the battery performance data to identify areas of the warehouse where battery performance may be unduly influenced by locations (e.g., top-shelf, westerly facing batteries may discharge quicker than batteries on the bottom shelf in the center of a warehouse). This information may be used to develop battery location rotation programs to ensure batteries are not stored in unfavorable spots for extended periods of time.

Battery Matching

According to one embodiment of the present application, the BLIS may operate as a battery matching service, where the BLIS creates a battery pack to recommend to a user (e.g., a customer). In some embodiments, the BLIS may use data collected from monitoring of one or more nodes to determine a combination of modules and/or cells to create a battery pack. The BLIS service may use data collected from a fleet of batteries to create the battery pack. The created battery pack may then be used to provide a battery pack to a user. For example, the determined battery pack may be used to draw cells, modules, and/or battery packs from inventory, and used in assembly of the battery pack. The created battery pack may also be used to build an inventory of battery packs, modules, and/or cells to be held in inventory to subsequently provide the created battery pack to the user.

In some embodiments, the BLIS service may operate the battery matching service to facilitate maintenance of battery packs. If the BLIS service determines that a WBMS node does not meet a quality criterion (e.g., of health or performance), the BLIS service may match a battery pack to the node and trigger dispatch of the battery pack to a geographic location at which a current battery pack of the node can be replaced (e.g., a service center). A battery pack at the node may then be replaced with the dispatched battery pack. In some embodiments, the BLIS service may predict that a node will fail to meet a quality criterion and trigger a dispatch based on the predicted failure. For example, the BLIS service may use a digital twin to predict a failure and trigger dispatch of a battery pack based on the predicted failure.

According to an aspect of the present application, in addition to providing localization, modeling and monitoring services, the BLIS service may operate as a battery matching service for maintenance and battery pack creation scenarios. Based on the data collected and the digital twins constructed from the models for cells and modules, the BLIS service may recommend the best combinations of modules and cells to create a battery pack by looking at the data across a broad fleet of batteries. This information can then be used to draw batteries from inventory and order them for the production line to create optimal performing battery packs while also minimizing production time by ensuring the right cells and modules are available on the production line at the right time. In addition, it can be used to ascertain that the correct cells and modules were combined. It will continue monitoring of the created module or pack as it returns to inventory. The BLIS service may identify the most compatible modules or cells for a battery pack and this information can be used to build an inventory of replacement parts, allowing specific modules or cells to be held in reserve to match a population of battery packs in the field. This may help ensure that a healthy population of compatible replacement parts are always in inventory. The same matching algorithm can be used throughout the lifecycle of the battery pack to facilitate maintenance of battery packs. If a module is detected as failing or underperforming, the BLIS service in some embodiments finds a match and dispatches it to a geographical location such as a service center where the battery can be updated with a matching module. The BLIS service may make the decision on where to dispatch the battery to by virtue of location information provided as an additional input from another system. The BLIS service may also predict potential failures if operational data is ingested through an integration interface and the model for the cell, module or pack is further refined. The BLIS service may be able to predict the failure of a battery through the digital twin simulation, identify a compatible module in inventory, dispatch it to the local service station and through integration with the customer's schedule (or the fleet owners maintenance schedule), setup an appointment for the battery pack to be serviced, thereby optimizing the maintenance cycle and removing operational cost while also avoiding catastrophic failures.

N'th Life Recommendation

In some embodiments, the BLIS service may use data gathered from monitoring to determine one or more subsequent uses of a battery. For example, the BLIS service may use data gathered from monitoring batteries used for a first application (e.g., electric cars) to determine a second application (e.g., electric scooters) of the batteries. In some embodiments, the BLIS service may use the data to parameterize a digital twin maintained in the BLIS service, and use the parameterization to project usability of a battery for subsequent uses. Example parameters generated from the digital twin may include temperature, cycle times, vibration history, impedance spectroscopy history, and/or other parameters. The BLIS service may use the determined parameters to project performance of the battery for subsequent use(s), and provide recommended subsequent use(s) based on the projected performance.

The information gathered in BLIS service can be combined with data gathered during the operation of the battery to determine the most appropriate second, third, fourth, or subsequent life of the battery. The combined data can be used to parameterize the digital twin model maintained in the BLIS service, grade the battery and based on the current and projected performance recommend a usage profile for the next lifecycle (e.g. a battery coming from a three year old car may be suitable for use in a new truck, forklift or scooter, depending on its SOH and SOC history, as well as other parameters collected such as temperature, cycle times, vibration history, impedance spectroscopy history, or other parameters).

As has been described, aspects of the present application provide a battery lifecycle insight system (BLIS). The BLIS may be a comprehensive battery lifecycle management service with its own user interfaces and connectivity options in some embodiments. However, it can also be integrated into existing enterprise resource planning systems through a set of well-defined APIs. For example, referring again to FIG. 7, the BLIS service 110 may include API integration point 718. The APIs may be access controlled and authenticated so that customers can only request and see their own data while seeing the raw data, calculated data and meta information about a specific cell, module or pack. APIs may allow not only for the extraction of data, but also for the ingestion of additional data about a specific battery, including battery formation information, operational information and location information.

Figure 9:
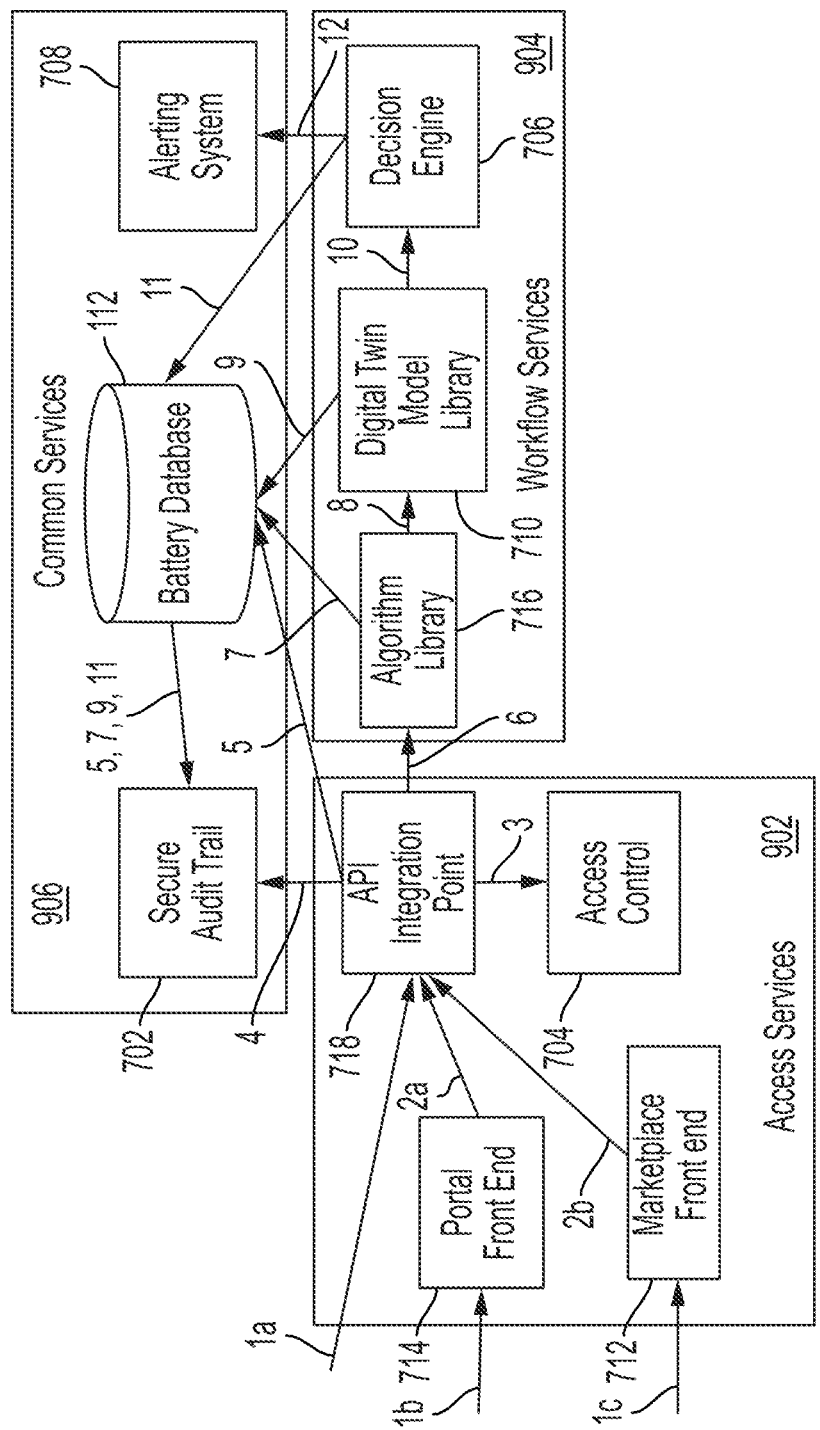
FIG. 9 illustrates a non-limiting example of a workflow according to an embodiment of the present application.

Various functions of a BLIS service have been described. The workflow of those functions may take any suitable form. The workflow itself can be defined dynamically through a user interface tool that creates a configuration file containing an expression of the composed service captured in a markup language. Thus, rapid experimentation of different workflows that are easily customized on a per customer basis may be achieved. The workflow blocks themselves may defined through a series of interfaces that in turn can be implemented as a series of micro-services. FIG. 9 illustrates a non-limiting example of a workflow according to an embodiment of the present application. The listed functional blocks may be grouped into access services 902, workflow services 904, and common services 906. The common services 906 may be called from any of the workflow services.

The flow of data is given by the following sequence illustrated in the figure.

Data such as voltage, temperature, and current are sensed and provided to the access services 902. Specifically, some data is sent directly (flow 1a) to the API integration point 718. Some data is sent first to the portal front end 714 (flow 1b) and then to the API integration point 718 (flow 2a), and some data is sent first to the marketplace front end 712 (flow 1c) and then to the API integration point (flow 2b).

The API integration point 718 verifies the identity of the WBMS node against the access control system function 704 (flow 3).

A secure audit log entry of the data ingestion is created in the secure audit trail 702 (flow 4).

The data is written to the battery database 112 for a given battery pack or module (flow 5).

The data is also passed to the algorithm library 716 (flow 6).

A determination is made as to which algorithms to apply, with the result being written to the battery database 112 (flow 7).

Control is passed to a digital twin (flow 8), which may be composed of a complex model of the battery cell, module, or pack by the digital twin model library 710.

The output of the digital twin from the digital twin model library 710 may be written to the battery database 112 (flow 9).

Control may be passed to the decision engine 706 (flow 10), which may decide whether to raise an alert (flow 12).

The results of the decision engine 706 may be written to the battery database 112 (flow 11). The data from flows 5, 7, 9, and 11 may be provided from the battery database 112 to the secure audit trail 702.

In response to the decision engine raising an alert (flow 12), control may be passed to the alerting system 708, which may send predefined alerts.

This workflow is a non-limiting example, as other manners of information exchange are possible. Also, it should be appreciated that the ordering or steps may differ from that shown, and multiple flows may be performed simultaneously.

It should be appreciated that the various functions described herein may be performed by a suitable processor configuration. For example, the WBMS nodes, gateways, and BLIS may, and in at least some embodiments do, each include at least one processor. The at least one processor executes processor-executable instructions to perform the functions of those items. For example, BLIS service 110 in some embodiments is implement by a plurality of processors (at least one processor) that execute processor-executable instructions to prompt performance of the functions described herein as being performed by the BLIS service. A storage device, such as one or more memories, including distributed memories, store the processor-executable instructions. If the BLIS service 110 is implemented in the Cloud, suitable combinations of storage devices and processors may be used to perform the described functions.

The terms "approximately" and "about" may be used to mean±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A battery management system, comprising:
   at least one processor; and
   a storage device storing processor-executable instructions which, when executed by the at least one processor, cause the at least one processor to:
   aggregate state of health information of a plurality of batteries in a non-operational state at one or more remote locations; and
   determine, using the aggregated state of health information of the plurality of batteries, an application for at least one of the plurality of batteries,
   wherein the processor-executable instructions, when executed by the at least one processor, cause the at least one processor to perform anomaly detection among the aggregated state of health information of the plurality of batteries, wherein performing the anomaly detection comprises:
   determining at least one parameter for each of the plurality of batteries;
   identifying at least one outlier value of the at least one parameter; and
   identifying at least one of the plurality of batteries that is associated with the at least one outlier value as anomalous.

2. The battery management system of claim 1, wherein the plurality of batteries were used for a first application, and determining, using the aggregated state of health information of the plurality of batteries, the application for the at least one battery comprises:
   determining a second application, different from the first application, for subsequent use of the at least one battery.

3. The battery management system of claim 1, wherein the aggregated state of health information comprises state of charge information.

4. The battery management system of claim 1, wherein the processor-executable instructions, when executed by the at least one processor, cause the at least one processor further to store the aggregated state of health information in a blockchain.

5. A battery management system, comprising:
   at least one processor; and
   a storage device storing processor-executable instructions which, when executed by the at least one processor, cause the at least one processor to:
   aggregate state of health information of a plurality of batteries in a non-operational state at one or more remote locations; and
   determine, using the aggregated state of health information of the plurality of batteries, an application for at least one of the plurality of batteries,
   wherein determining, using the aggregated state of health information of the plurality of batteries, the application for the at least one battery comprises:
   parameterizing a digital twin of the plurality of batteries using the aggregated state of health information of the plurality of batteries;
   projecting performance of the at least one battery for the application; and
   determining the second application for the at least one battery based on the projected performance of the at least one battery for the second application.

6. A method of managing a fleet of batteries, comprising:
   aggregating state of health information of a plurality of batteries in a non-operational state at one or more remote locations; and
   determining, using the aggregated state of health information of the plurality of batteries, an application for at least one of the plurality of batteries,
   wherein determining, using the aggregated state of health information of the plurality of batteries, the application for the at least one battery comprises:
   parameterizing a digital twin of the plurality of batteries using the aggregated state of health information of the plurality of batteries;
   projecting performance of the at least one battery for the application; and
   determining the second application for the at least one battery based on the projected performance of the at least one battery for the second application.

7. The method of claim 6, wherein the plurality of batteries were used for a first application and determining, using the aggregated state of health information of the plurality of batteries, the application for the at least one battery comprises:
   determining a second application, different from the first application, for subsequent use of the at least one battery.

8. The method of claim 6, further comprising storing the aggregated state of health information in a blockchain.

9. A method of managing a fleet of batteries, comprising:
   aggregating state of health information of a plurality of batteries in a non-operational state at one or more remote locations; and
   determining, using the aggregated state of health information of the plurality of batteries, an application for at least one of the plurality of batteries,
   further comprising performing anomaly detection among the aggregated state of health information of the plurality of batteries, wherein performing the anomaly detection comprises:
   determining at least one parameter for each of the plurality of batteries;
   identifying at least one outlier value of the at least one parameter; and
   identifying at least one of the plurality of batteries that is associated with the at least one outlier value as anomalous.

10. The method of claim 9, further comprising recommending use of a first battery of the plurality of batteries.

11. The method of claim 9, further comprising, in response to analyzing the aggregated state of health information, providing an updated sensing algorithm to a node configured to sense state of health information of a first battery of the plurality of batteries.

* * * * *